United States Patent [19]

Machala III

[11] Patent Number: 5,265,028
[45] Date of Patent: Nov. 23, 1993

[54] OPTIMIZATION SYSTEM

[75] Inventor: Charles F. Machala III, Dallas, Tex.

[73] Assignee: Texas Instruments Incorporated, Dallas, Tex.

[21] Appl. No.: 632,280

[22] Filed: Dec. 21, 1990

[51] Int. Cl.⁵ .............................................. G06F 15/20
[52] U.S. Cl. ................................... 364/488; 364/578; 364/DIG. 2; 364/916.3; 371/23; 395/500
[58] Field of Search ............... 364/200, 900, 488, 578, 364/DIG. 2; 371/23; 395/500

[56] References Cited

U.S. PATENT DOCUMENTS

| | | | |
|---|---|---|---|
| 4,590,581 | 5/1986 | Widdoes, Jr. | 364/578 |
| 4,635,218 | 1/1987 | Widdoes, Jr. | 364/578 |
| 4,763,288 | 8/1988 | Deering et al. | 364/578 |
| 4,961,156 | 10/1990 | Takasaki | 364/490 X |
| 5,051,911 | 9/1991 | Kimura et al. | 364/578 X |

*Primary Examiner*—Edward R. Cosimano
*Attorney, Agent, or Firm*—Ira S. Matsil; James C. Kesterson; Richard L. Donaldson

[57] ABSTRACT

A modeling system 10 comprises a central processing unit 12 coupled to an arithmetic logic unit 16. A device testing system 18 is used to imperically analyze the operational characteristics of a transistor to be modeled by the system 10. A set of parameter values are stored in a memory circuit 14 coupled to central processing unit 12. An input and display system 20 is used to interact with the central processing unit 12. The central processing unit 12 uses the arithmetic logic unit 16 to calculate an objective function which comprises a sum of a plurality of two types of terms. The first term within the objective function utilizes relative weighting with respect to the values of the remaining terms while the second type of term utilizes absolute weighting with respect to the remaining terms. Both types of terms are normalized such that they are of substantially equal significance during the calculation of the objective function. Once a minimum value of the objective function has been found, a set of final modeling parameters is output to a circuit design system 21 which utilizes the final set of modeling parameters to design circuitry comprising a plurality of transistors substantially similar to the transistor modeled by the system 10.

13 Claims, 1 Drawing Sheet

FIG. 2 (PRIOR ART)  $OBJ = \sum_{i=1}^{N} \frac{(D1_{m_i} - D1_{c_i})^2}{D1_{m_i}^2} + \frac{(D2_{m_i} - D2_{c_i})^2}{D2_{m_i}^2} + \cdots + \frac{(DN_{m_i} - DN_{c_i})^2}{DN_{m_i}^2}$ FIG. 4  $OBJ = \sum_{i=1}^{N} \dfrac{\dfrac{(I_{cm_i} - I_{cc_i})^2}{I_{cm_i}^2}}{\dfrac{(I_{cm_{1_T}} - I_{cc_{1_T}})^2}{I_{cm_{1_T}}^2}} + \dfrac{(I_{C_{m_i}} - I_{C_{c_i}})^2}{(I_{C_{m_{1_T}}} - I_{C_{c_{1_T}}}^2)} + \cdots$ 30  32

OPTIMIZATION SYSTEM

TECHNICAL FIELD OF THE INVENTION

This invention relates in general to the field of electronic systems and more particularly to an improved optimization system.

BACKGROUND OF THE INVENTION

Computerized modeling of electronic devices allows for inexpensive and efficient computerized design of electric circuits and systems. A discrete electronic device such as a bipolar transistor requires a large number of parameters to accurately model its operational characteristics. For example, a typical bipolar transistor using the SPICE modeling system requires on the order of thirty parameters to sufficiently specify its operational characteristics.

Once the parameters of an electronic device have been calculated so that the electronic device can be modeled, computer aided design systems can efficiently design circuits using the electronic device and use the calculated parameters to accurately predict the operational characteristics of the circuit comprising the device. In order to calculate the thirty or so parameters used to model an electronic device such as a bipolar transistor, the device is tested at various points in its operating spectrum to construct a data set of measured data values. A first guess is then made at the values for the modeling parameters of the device. An objective function is then calculated which represents a summation of the error between the measured and calculated data. Using an iterative process, the parameters are changed to minimize the value of the objective function. When the objective function is minimized, the values for the modeling parameters represent the closest approximation of the modeled parameters to the actual measured parameters.

A problem occurs within the objective function as many of the data sets have absolute values which are very small compared to the absolute values of other of the data sets. As such, when the objective function is calculated, the terms having smaller absolute values will not be significant as compared to the terms having larger absolute values. An additional problem inheres in the fact that a single term within the objective function may be associated with a data set which has a wide range of values within the data set. Accordingly, a single data point which has an absolute value significantly less than another data point within the same data set will not be accorded the same weight in the calculation of the objective function. Accordingly, some prior systems have incorporated normalization schemes within each term so that each data point within the objective function is accorded equal weight.

A problem occurs, however, when data points are included which are not modeled well and given the same relative weighting as data points which are modeled well. Accordingly, a need has arisen for a modeling system which can implement variable weighting of the data sets to provide the most accurate modeling of a particular device.

SUMMARY OF THE INVENTION

In accordance with the present invention, a modeling system for generating a computer model of a transistor is provided which comprises circuitry for calculating initial calculated values of operation variables associated with the transistor to be modeled at various operating points using an initial set of modeling parameters. The system of the present invention further comprises memory circuitry operable to store the initial calculated values and imperically measured values of the operation variable for the various operating points of the transistor. Arithmetic circuitry is used to calculate an objective function which is a measure of the error between the calculated values and the imperically measured values. The objective function comprises a sum of a plurality of two types of terms. The first type of term is relatively weighted with respect to the remaining data terms. The second type of term is absolutely weighted with respect to the remaining data terms. Both types of terms are normalized such that they are substantially equal in significance in the calculation of the objective function.

According to one embodiment of the present invention, the system further comprises circuitry for altering the values of the modeling parameters. The altered constants are then used to recalculate the calculated values of the transistor operation variables. The recalculated values of the operation variables are then used to calculate a new value for the objective function. When a minimum value for the objective function has been determined, the set of parameters used to calculate the minimum value of the objective function can be used to model the transistor.

According to still another embodiment of the present invention, a circuit design system is used to design a circuit comprising transistors having similar operational characteristics to the transistor modeled by the modeling system. The circuit design system uses the final set of modeling parameters output by the modeling system to design the circuit.

According to still another embodiment of the present invention, a transistor testing system is used to imperically measure values for the operation variables associated with the various operating points of the transistor to be modeled by the modeling system.

An important technical advantage of the system of the present invention inheres in the fact that the use of relatively weighted and absolutely weighted terms within the calculation of the objective function allows for the individual determination of which method of weighting is most appropriate for each term depending upon the characteristics of the data set associated with that term. The flexibility of the use of both relative and absolute weighting allows for the efficient and accurate modeling of transistors through the use of the system of the present invention.

BRIEF DESCRIPTION OF THE DRAWINGS

A more complete understanding of the present invention may be acquired by referring to the detailed description and claims when considered in connection with the accompanying drawings, wherein:

FIG. 2 is a mathematical formula illustrating the mathematical terms of an objective function used in prior systems which incorporate relative weighting of the terms involved;

FIG. 4 is a mathematical characterization of a portion of the objective function used in the system of the present invention.

DETAILED DESCRIPTION OF THE INVENTION

Figure 1:
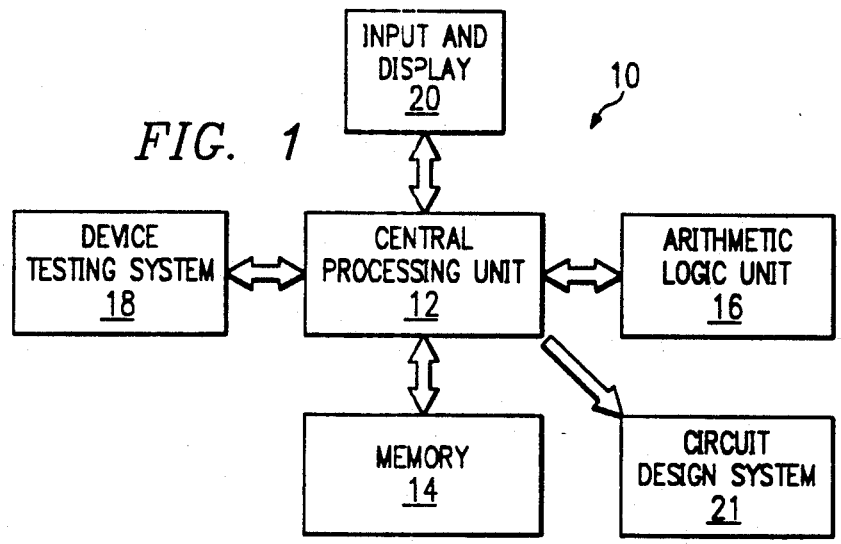
FIG. 1 is a functional block diagram of a modeling and optimization system which may utilize the teachings of the present invention.

FIG. 1 illustrates a system 10 which comprises a central processing unit 12. Central processing unit 12 is coupled to a memory circuit 14 through a bi-directional bus. Memory circuit 14 may comprise circuitry for storing programs to be run by central processing unit 12. Memory circuit 14 can also be used to store the data sets used in conjunction with the system of the present invention.

Central processing unit 12 is also coupled through a bi-directional data bus to an arithmetic logic unit 16. Arithmetic logic unit 16 comprises circuitry for performing the arithmetic calculations necessary during the operation of the system of the present invention.

Central processing unit 12 is also coupled to a device testing system 18. The device testing system 18 is operable to acquire the measured values of the operational characteristics of the device to be modeled by system 10. Device testing system 18 may act under the direction of the central processing unit 12 or it may comprise an autonomous system which constructs the measured data set such that central processing unit 12 merely retrieves the data set and stores it in memory 14 such that it may be used in the modeling process. Device testing system 18 may comprise, for example, an HP4145 Semiconductor Parameter Analyzer manufactured by Hewlett Packard, Inc. A circuit design system 21 is coupled to central processing unit 12 such that circuit design system 21 may receive the final values of the modeling parameters and use these parameters to design circuits comprising devices similar to the modeled device. Circuit design system 21 may comprise, for example, a conventional SPICE circuit design software system.

Central processing unit 12 is also coupled to an input and display unit 20. Input and display unit 20 may comprise, for example, a keyboard and a monitor for inputting values into central processor unit 12 and for displaying information from central processing unit 12, respectively.

System 10 may comprise, for example, a main frame computer or workstation coupled to a testing system which may, for example, measure the operational characteristics of a bipolar transistor. It should be understood that while the system of the present invention will be described with reference to the modeling of an electronic device, the invention may be applied to the modeling of any system which is capable of being represented by parameters with associated modeling equations. The description of the present invention with reference to the modeling of electronic devices is solely for the purpose of teaching the important technical advantages of the present invention and should not be construed to limit the teachings of the present invention to this or any specific embodiment.

FIG. 2 is a mathematical expression which illustrates the structure of the objective function as it was used in prior modeling and optimization systems. The terms D1, D2 and DN refer to the various data points from a device which is to be modeled. The objective function illustrated in FIG. 2 comprises the summation of the error between the measured values of each of the data points and the calculated values of each of the data points. The form of the objective function in FIG. 2 utilizes the relative weighting scheme common in prior systems. This scheme normalizes each point within a particular data set to eliminate problems associated with wide variances in the absolute values of data points within a particular data set.

Figure 3A:
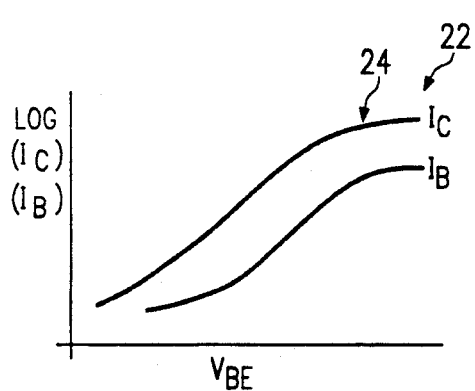
FIGS. 3a and 3b are graphical illustrations of operational characteristics of an exemplary device which may be modeled using the teachings of the present invention.
Figure 3B:
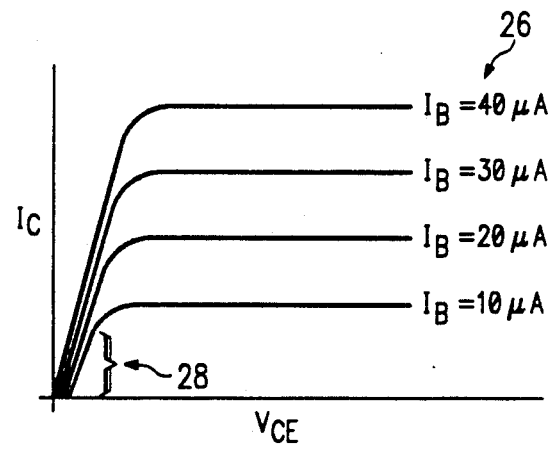

FIGS. 3a and 3b are graphical illustrations of two operation variables of bi-polar transistors which will be helpful in explaining the problems associated with the prior art objective function as well as the benefits of the objective function used in conjunction with the system of the present invention. FIG. 3a illustrates a graph 22 which is commonly referred to as a Gummel curve. Graph 22 illustrates the relationship of the collector current, $I_C$, and the base current, $I_B$, to the base emitter voltage, $V_{BE}$. The data set comprising the curve 24 illustrating the collector current $I_C$, can have absolute values ranging on the order of $1e^{-12}$ to absolute values on the order of 0.1. In the case of the Gummel curve 22, each of these data points is equally valuable and equally important to the final modeling of the device. As such, each data point must be normalized during the calculation of the objective function so that the absolute values of the larger values within the data set do not overwhelm the errors introduced in the absolute values of the smaller values within the data set. This normalization is accomplished as shown in FIG. 2 by dividing by the square of the measured value within each of the terms. Accordingly, as each data point is introduced into the summation of the Gummel curve term within the objective function, the calculated value for the data point is subtracted from the measured value for the data point and the difference is squared. The square of the measured value is then divided from this square of the difference to achieve the normalized value for this data point. This calculation is done for each of the data points and each of these normalized values are summed together to achieve a summation value for that particular term. The summation values for each of the terms are then summed together to achieve a total value for the objective function.

The normalization procedure discussed with reference to FIG. 2 used in conjunction with prior systems works very well for data sets which have a wide range of absolute values where all of the data points within the data set are equally important. FIG. 3b illustrates a set of output data associated with a bipolar transistor where these prerequisites are not true.

FIG. 3b is a graphical illustration of the relationship of the collector current, $I_C$, to the collector emitter voltage, $V_{CE}$, as the base current, $I_B$ is varied. This relationship is shown in an output characteristic graph indicated generally at 26 in FIG. 3b. The data set illustrated by output characteristic graph 26 is an excellent example of a data set which does not lend itself well to the normalization procedure used in prior systems. The data set shown in FIG. 3b has a range of absolute values on the order of $1e^{-6}$ to $1e^{-3}$. Because of this relatively narrow range, the normalization procedure described previously is not as necessary as each of the data points within the data set are relatively comparable in terms of magnitude. However, the key consideration in the altering of the calculation of the term within the objective function associated with this data set is that a portion of the data set shown in graph 26 is not critical in the operation of the bipolar transistor to be modeled and is not modeled well using modeling parameters. This range of data values is indicated generally at 28 on graph 26 and comprises the data values having the smaller magnitudes within the data set shown in graph 26. The device whose characteristics are illustrated in graph 26 usually operates in the operational realm characterized by the remainder of the graph 26 excluding portion 28. As such, a restructuring of the objective function which minimizes the influence of the data points within portion 28 is appropriate. This restructuring is accomplished by not normalizing the data set illustrated in graph 26 on a point by point basis. Specifically, this is accomplished by not dividing by the measured value but merely squaring the difference between the calculated and measured value and then summing this difference of squares. This is referred to as "absolute weighting" of the data points within a data set. A data set which is normalized on a point by point basis is deemed to be subjected to "relative weighting".

Absolute weighting of a data set provides that the data points having the large absolute values will be given more weight in the calculation of the objective function than the data points having smaller absolute values. For certain data sets, giving the larger values more weight is appropriate and allows for more accurate modeling of the device. A problem occurs, however, when a term within the objective function which has been subjected to relative waiting is to be summed with a term which has been subjected to absolute weighting. A second normalization procedure illustrated in FIG. 4 solves this problem. Referring to FIG. 4, a term 30 illustrates the calculations associated with the collector current which is subjected to relative weighting. Further, a term 32 illustrates the calculations associated with the collector current, $I_C$, which is subjected to absolute weighting for the reasons discussed previously. The remaining terms within the actual objective function have been omitted for purposes of clarity. However, it should be understood that there could be literally dozens of operating variables which are affected by the thirty or so SPICE constants and which would be included in the calculation of any particular objective function. Referring to term 30, the error between the measured and calculated values of a particular data point in a first collector current data set is calculated and squared. The square of the measured valued for the collector current is then divided from this squared difference. This term thus comprises a relatively weighted normalized term which is comparable to a percentage error of the measured value versus the calculated value. Referring now to term 32, the calculated value of the collector current is subtracted from the measured value for the collector current at each particular data point within the second collector current data set. This difference is then squared. This value essentially comprises an absolute error between the measured and calculated values of the collector current for a particular data point within the second collector current data set. In order that the absolute error and the relative error may be compared without one of the terms dominating the other term because of a much larger absolute value, each objective function value associated with a data set is divided by the initial value of the objective function for that data set. These calculations are repeated for each data set. This second normalization step effectively normalizes each of the individual objective function values associated with each term relative to one another. Accordingly, the terms can be added to get a total objective function for the system with each term receiving equal weight. In operation, the initial value for each of the terms within the objective function such as, for example, the denominators of terms 30 and 32 shown in FIG. 4 are stored in memory so that they may be used in later iterations of the objective function. The relative error terms for the first collector current data sets are then summed together to get a total relative error. Similarly, the absolute errors for the second collector current data set are summed to get a total absolute error. The total error values are then summed to yield a total value for the objective function for a particular iteration.

The objective function is then iteratively run through optimization routines using known methods such as those described in applicants co-pending application entitled "OPTIMIZATION SYSTEM", Ser. No. 632,288 filed Dec. 21, 1990, abandoned, now Ser. No. 988,385, the specification of which is hereby incorporated by reference. With each iteration, the modeling parameters are varied and new values for the various operation variables of the device are calculated. The objective function is then calculated using the formula shown in FIG. 4. Using optimization methods, the total value of the objective function is thus minimized and the values for the modeling parameters of the final iteration may then be used to model the particular device. The modeled device can then be used by a circuit design system such as system 21 to design circuitry incorporating devices similar to the modeled device.

Referring to FIG. 4, terms 30 and 32 are calculated in each iteration by calculating for each data set the quotient of an error function for that data set on that iteration divided by the same error function for that data set for the first iteration and summing these quotients. For the first iteration, this procedure results in the value of the objective function shown in FIG. 4 always being equal to the number of data sets (N).

In summary, a modeling system and method have been described which allow for the comparison of terms within an objective function which are subjected to relative and absolute weighting. The term by term normalization of the error terms within an objective function allows for each term used in the objective function to be subjected to either absolute or relative weighting depending upon which provides the most accurate modeling of the particular device.

Although the present invention has been described in detail, it should be understood that various changes, substitutions and alterations can be made hereto without departing from the spirit and scope of the invention as defined by the appended claims.

What is claimed is:

1. A modeling system for generating a computer model of a device given a plurality of measured values of operation variables associated with various operating points of said device, the system comprising:

calculation circuitry for calculating initial values of the operation variables at the various operating points using an initial set of modeling parameters such that for each of the operating points there is a measured value and an initial calculated value;

an electronic memory for storing said initial calculated values and said measured values;

a bi-directional data bus for coupling said calculation circuitry to said memory;

said calculation circuitry additionally for calculating an objective function as a measure of the error between said calculated values and the measured values, said objective function comprising a sum of a plurality of two types of terms, one of said plurality of terms associated with each of a plurality of data sets comprising values of said operating variables, said first type of term associated with an operating variable which is relatively weighted with respect to the remaining terms, said second type of term associated with an operating variable which is absolutely weighted with respect to the remaining terms, both said first and second types of terms being normalized such that they are of substantially equal significance in the calculation of said objective function.

2. The system of claim 1 and further comprising a device testing system operable to measure the measured values of the operating variables associated with various operating points of a device to be modeled by the modeling system.

3. The system of claim 1 wherein said device comprises a transistor.

4. The system of claim 3 wherein said transistor comprises a bipolar transistor.

5. The system of claim 1 wherein said first type of term is associated with a first data set comprising values of a first operating variable and wherein said first term comprises a quotient of a first numerator and a first denominator, said first numerator comprising a first summation of a plurality of first error values, one of said first error values associated with each point in said first data set, said first error values comprising a sum of values for a first error function calculated for each of said points, said first error function for each point comprising the quotient of the square of the difference between a measured value and a calculated value of said first operating variable for a particular point within said first data set and the square of the measured value of said first operating variable at said particular point, said first denominator comprising a value equal to said first summation of said plurality of first error values calculated using said initial set of modeling parameters; and said second type of term associated with a second data set comprising values of a second operating variable, said second type of term comprising a quotient of a second numerator and a second denominator, said second numerator comprising a summation of a plurality of second error values, one of said second error values associated with each point in said second data set, said second error values each comprising the square of the difference between a measured value and a calculated value of said second operating variable for a particular data point within said second data set, said second denominator comprising a value equal to said second summation of said plurality of second error values calculated using said initial set of modeling parameters.

6. The system of claim 5 wherein said modeling system is further operable for:
altering the values of said modeling parameters;
inputting said altered parameters into said circuitry for calculating initial calculated values of said operating variables such that said calculated values of said operating variables may be recalculated for each new set of altered parameters;
inputting said recalculated values of said operating variables into said circuitry for calculating an objective function such that said objective function may be recalculated for each new set of altered parameters; and
determining a minimum value for said objective function, a model of said device comprising a final set of parameters used to calculate said minimum value.

7. A modeling system for generating a computer model of a transistor, comprising:
a transistor testing system operable to measure a plurality of measured values of operating variables associated with various operating points of a transistor to be modeled by the modeling system;
calculation circuitry for calculating values of said operating variables at said various operating points using an initial set of modeling parameters such that for each of said operating points there is a measured value and an initial calculated value;
an electronic memory for storing said initial calculated values and said measured values;
a bi-directional data bus for coupling said calculation circuitry to said electronic memory;
said calculation circuitry additionally for calculating an objective function as a measure of the error between said calculated and said measured values, said objective function comprising a sum of a plurality of two types of terms, one of said plurality of terms associated with each of said operating variables;
said first type of term associated with a first data set comprising values of a first operating variable and wherein said first term comprises a quotient of a first numerator and a first denominator, said first numerator comprising a first summation of a plurality of first error values, one of said first error values associated with each point in said first data set, said first error values comprising a sum of values for a first error function calculated for each of said points, said first error function for each point comprising the quotient of the square of the difference between a measured value and a calculated value of said first operating variable for a particular point within said first data set and the square of the measured value of said first operating variable at said particular point, said first denominator comprising a value equal to said first summation of said plurality of first error values calculated using said initial set of modeling parameters; and said second type of term associated with a second data set comprising values of a second operating variable, said second type of term comprising a quotient of a second numerator and a second denominator, said second numerator comprising a summation of a plurality of second error values, one of said second error values associated with each point in said second data set, said second error values each comprising the square of the difference between a measured value and a calculated value of said second operating variable for a particular data point within said second data set, said second denominator comprising a value equal to said second summation of said plurality of second error values calculated using said initial set of modeling parameters.

8. The system of claim 7 wherein said modeling system is further operable for:
altering the values of said modeling parameters;
inputting said altered parameters into said circuitry for calculating calculated values of said operating variables such that said calculated values of said operating variables may be recalculated for each new set of altered parameters;

inputting said recalculated values of said operating variables into said circuitry for calculating an objective function such that said objective function may be recalculated for each new set of altered parameters; and determining a minimum value for said objective function, a model of said transistor comprising a final set of parameters used to calculate said minimum value.

9. A method for generating a computer model of an electronic device, comprising the steps of:

measuring said electronic device using a device testing system to generate a plurality of measured values of operating variables associated with various operating points of the electronic device;

providing a pre-determined initial set of modeling parameters;

calculating values of the operating variables at the various operating points using said initial set of modeling parameters such that for each of the operating points there is a measured value and an initial calculated value;

storing said calculated values and said measured values;

calculating an objective function as a measure of the error between the calculated and the measured values, the objective function comprising a sum of a plurality of two types of terms, one of the plurality of terms associated with each of a plurality of data sets, each of the data sets comprising a plurality of values of one of the operating variables data sets;

wherein the first type of term is associated with a first data set comprising values of a first operating variable and wherein the first term comprises a quotient of a first numerator and a first denominator, the first numerator comprising a first summation of a plurality of first error values, one of the first error values associated with each point in the first data set, the first error values comprising a sum of values for a first error function calculated for each of the points, the first error function for each point comprising the quotient of the square of the difference between a measured value and a calculated value of the first operating variable for a particular point within the first data set and the square of the measured value of the first operating variable at the particular point, the first denominator comprising a value equal to the first summation of the plurality of first error values calculated using the initial set of modeling parameters;

wherein the second type of term is associated with a second data set comprising values of a second operating variable, the second type of term comprising a quotient of a second numerator and a second denominator, the second numerator comprising a summation of a plurality of second error values, one of the second error values associated with each point in the second data set, the second error values each comprising the square of the difference between a measured value and a calculated value of the second operating variable for a particular data point within the second data set, the second denominator comprising a value equal to the second summation of the plurality of second error values calculated using the initial set of modeling parameters;

designing a circuit comprising at least one of said electronic device; and predicting the operational characteristics of said circuit comprising said electronic device.

10. The method of claim 9 wherein said electronic device comprises a transistor.

11. The method of claim 9 wherein said designing step comprises the step of designing a circuit comprising circuit devices having similar operational characteristics as a test device using the final set of constants and a circuit design system.

12. The method of claim 9 and further comprising the steps of:

altering the values of the modeling parameters;

calculating new calculated values of the operating variables using the arithmetic circuit for each new set of altered parameters;

recalculating the objective function using the arithmetic circuit for each new set of altered parameters; and determining a minimum value for the objective function, a model of the transistor comprising a final set of parameters used to calculate the minimum value.

13. The method of claim 12 wherein said step of measuring an electronic device comprises the step of measuring a test device.

* * * * *